(12) United States Patent
Chase et al.

(10) Patent No.: US 10,734,282 B2
(45) Date of Patent: Aug. 4, 2020

(54) SUBSTRATE CONDUCTOR STRUCTURE AND METHOD

(71) Applicant: Intel Corporation, Santa Clara, CA (US)

(72) Inventors: Harold Ryan Chase, Mesa, AZ (US); Mihir K Roy, Chandler, AZ (US); Mathew J Manusharow, Phoenix, AZ (US); Mark Hlad, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/141,181

(22) Filed: Sep. 25, 2018

(65) Prior Publication Data

US 2019/0027405 A1    Jan. 24, 2019

Related U.S. Application Data

(60) Continuation of application No. 15/220,143, filed on Jul. 26, 2016, now Pat. No. 10,121,701, which is a
(Continued)

(51) Int. Cl.
| | |
|---|---|
| *H05K 1/02* | (2006.01) |
| *H01L 23/00* | (2006.01) |
| *H01L 23/48* | (2006.01) |
| *H01L 21/768* | (2006.01) |
| *H01L 21/288* | (2006.01) |
| *H05K 3/46* | (2006.01) |

(Continued)

(52) U.S. Cl.
CPC ...... *H01L 21/76879* (2013.01); *H01L 21/288* (2013.01); *H01L 21/76838* (2013.01); *H01L 23/00* (2013.01); *H01L 23/36* (2013.01); *H01L 23/481* (2013.01); *H01L 23/49827* (2013.01); *H01L 23/552* (2013.01); *H05K 1/0219* (2013.01); *H05K 1/0222* (2013.01); *H05K 3/4602* (2013.01); *H01L 2224/131* (2013.01); *H01L 2224/16225* (2013.01); *H01L 2224/16227* (2013.01); *H01L 2224/32245* (2013.01); *H01L 2224/73253* (2013.01); *H05K 2201/09581* (2013.01)

(58) Field of Classification Search
CPC .......... H05K 2201/09563; H05K 2201/09572; H01L 23/49827; H01L 23/49838
See application file for complete search history.

(56) References Cited

U.S. PATENT DOCUMENTS

| | | |
|---|---|---|
| 4,999,318 A | 3/1991 | Takahumi et al. |
| 5,414,222 A | 5/1995 | Sen et al. |

(Continued)

OTHER PUBLICATIONS

U.S. Appl. No. 13/533,655 U.S. Pat. No. 9,406,587, filed Jun. 26, 2012, Substrate Conductor Structure and Method.

(Continued)

*Primary Examiner* — Matthew L Reames
*Assistant Examiner* — John A Bodnar
(74) *Attorney, Agent, or Firm* — Schwegman Lundberg & Woessner, P.A.

(57) ABSTRACT

Embodiments of substrates, semiconductor devices and methods are shown that include elongated structures to improve conduction. Elongated structures and methods are also shown that provide electromagnetic isolation to reduce noise in adjacent components.

11 Claims, 5 Drawing Sheets

Related U.S. Application Data division of application No. 13/533,655, filed on Jun. 26, 2012, now Pat. No. 9,406,587.

(51) Int. Cl.
  *H01L 23/552* (2006.01)
  *H01L 23/498* (2006.01)
  *H01L 23/36* (2006.01)

(56) References Cited

U.S. PATENT DOCUMENTS

| | | | |
|---|---|---|---|
| 6,139,904 | A | 10/2000 | Yamasaki et al. |
| 6,169,904 | B1 | 1/2001 | Ayala et al. |
| 7,036,710 | B1 | 5/2006 | Bartley et al. |
| 7,781,889 | B2 | 8/2010 | Leader et al. |
| 9,406,587 | B2 | 8/2016 | Chase et al. |
| 2001/0022391 | A1 | 9/2001 | Ishihara et al. |
| 2002/0006468 | A1 | 1/2002 | Paranjpe et al. |
| 2002/0134685 | A1 | 9/2002 | Chakravorty et al. |
| 2004/0217830 | A1 | 11/2004 | Hansen et al. |
| 2005/0178585 | A1* | 8/2005 | Kim .................. H05K 1/115 174/262 |
| 2006/0001166 | A1 | 1/2006 | Igarashi et al. |
| 2006/0043568 | A1 | 3/2006 | Abe et al. |
| 2007/0194431 | A1 | 8/2007 | Corisis et al. |
| 2008/0001286 | A1 | 1/2008 | Leader et al. |
| 2008/0083558 | A1 | 4/2008 | Chujo et al. |
| 2010/0284140 | A1 | 11/2010 | Corisis et al. |
| 2010/0307809 | A1* | 12/2010 | Noda ................ H05K 1/115 174/266 |
| 2011/0185330 | A1 | 7/2011 | Collins et al. |
| 2011/0240357 | A1 | 10/2011 | Kariya et al. |
| 2011/0241040 | A1 | 10/2011 | Yu et al. |
| 2011/0304999 | A1 | 12/2011 | Yu et al. |
| 2012/0153505 | A1 | 6/2012 | Chi et al. |
| 2012/0199386 | A1 | 8/2012 | Adachi et al. |
| 2013/0100625 | A1* | 4/2013 | Fujii ................. H05K 1/0366 361/783 |
| 2013/0341772 | A1 | 12/2013 | Chase et al. |
| 2014/0166355 | A1* | 6/2014 | Hong ................. H05K 3/426 174/264 |
| 2016/0336223 | A1 | 11/2016 | Chase et al. |

OTHER PUBLICATIONS

U.S. Appl. No. 15/220,143, filed Jul. 26, 2016, Substrate Conductor Structure and Method.
"U.S. Appl. No. 13/533,655, Final Office Action dated Mar. 6, 2014", 17 pgs.
"U.S. Appl. No. 13/533,655, Final Office Action dated Apr. 21, 2015", 21 pgs.
"U.S. Appl. No. 13/533,655, Non Final Office Action dated Aug. 1, 2013", 15 pgs.
"U.S. Appl. No. 13/533,655, Non Final Office Action dated Sep. 18, 2015", 18 pgs.
"U.S. Appl. No. 13/533,655, Non Final Office Action dated Nov. 24, 2014", 20 pgs.
"U.S. Appl. No. 13/533,655, Notice of Allowance dated Apr. 11, 2016", 11 pgs.
"U.S. Appl. No. 13/533,655, Response filed Feb. 24, 2015 to Non Final Office Action dated Nov. 24, 2014", 7 pgs.
"U.S. Appl. No. 13/533,655, Response filed Jun. 6, 2014 to Final Office Action dated Mar. 6, 2014", 7 pgs.
"U.S. Appl. No. 13/533,655, Response filed Jun. 24, 2013 to Restriction Requirement dated May 22, 2013", 5 pgs.
"U.S. Appl. No. 13/533,655, Response filed Jul. 7, 2015 to Final Office Action dated Apr. 21, 2015", 7 pgs.
"U.S. Appl. No. 13/533,655, Response filed Nov. 1, 2013 to Non Final Office Action dated Aug. 1, 2013", 7 pgs.
"U.S. Appl. No. 13/533,655, Restriction Requirement dated May 22, 2013", 6 pgs.
"U.S. Appl. No. 13/533,656, Response filed Nov. 6, 2015 to Non Final Office Action dated Sep. 18, 2015", 6 pgs.
"U.S. Appl. No. 15/220,143, Examiner Interview Summary dated Jan. 26, 2018", 3 pgs.
"U.S. Appl. No. 15/220,143, Examiner Interview Summary dated Sep. 24, 2018", 3 pgs.
"U.S. Appl. No. 15/220,143, Non Final Office Action dated Oct. 13, 2017", 16 pgs.
"U.S. Appl. No. 15/220,143, Notice of Allowance dated Jun. 15, 2018", 13 pgs.
"U.S. Appl. No. 15/220,143, Preliminary Amendment filed Jul. 27, 2016", 6 pgs.
"U.S. Appl. No. 15/220,143, Response filed Jan. 16, 2018 to Restriction Requirement dated Oct. 13, 2017", 9 pgs.

* cited by examiner

SUBSTRATE CONDUCTOR STRUCTURE AND METHOD

CROSS-REFERENCE TO RELATED APPLICATION

This application is a continuation of U.S. patent application Ser. No. 15/220,143, filed Jul. 26, 2016, which is a division of U.S. patent application Ser. No. 13/533,655, filed Jun. 26, 2012, which is incorporated by reference herein in its entirety.

TECHNICAL FIELD

Embodiments pertain to integrated circuit (IC) dies and die packages, and associated methods.

BACKGROUND

Semiconductor dies are often coupled to other circuitry in an electronic system through a substrate. The substrate includes interconnection circuitry that routes power and data between other electrical components and the semiconductor die that is coupled to the substrate.

Due to the constant pressure for smaller and thinner devices, improvements in interconnection circuitry are desired to permit the miniaturization of components, and improve performance and manufacturability of components such as semiconductor dies and substrates.

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Figure 1:
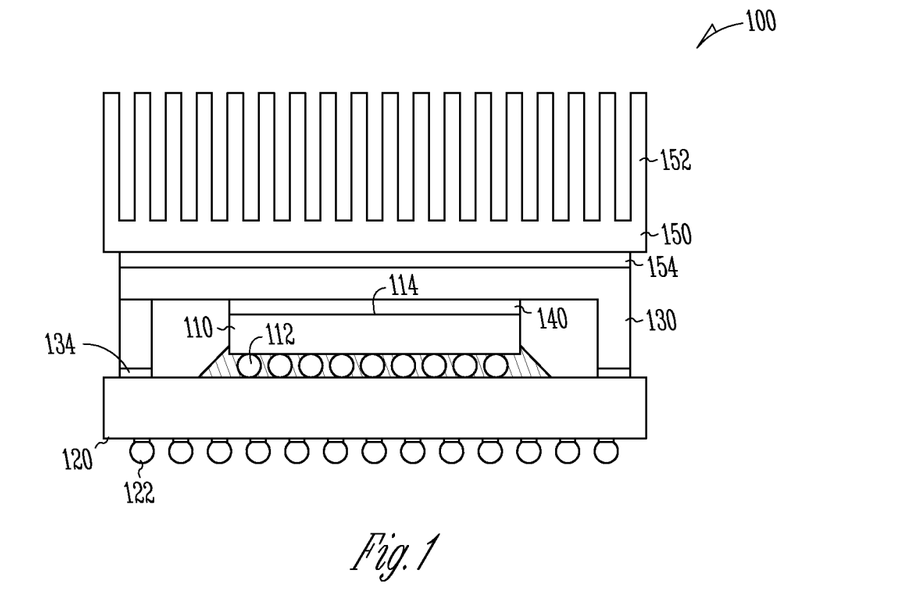
FIG. 1 is a cross section view of an IC package in accordance with some embodiments.

FIG. 1 shows a cross-sectional representation of an IC package 100. In embodiments where the IC die is a processor die, the IC package can be termed a processor assembly. IC package 100 includes an IC die 110 mounted in "flip-chip" orientation with its active side facing downward to couple with an upper surface of a substrate 120, through solder balls or bumps 112. In one example, the substrate 120 can include additional contacts 122 on its opposite surface for mating with additional packaging structure (not shown).

Die 110 generates its heat from internal structure, including wiring traces, located near its active side; however, a significant portion of the heat is dissipated through its back side 114. Heat that is concentrated within the die is dissipated to a large surface that is in contact with the die in the form of an integrated heat spreader 130. A thermal interface material 140 is often provided between the die 110 and integrated heat spreader 130.

In one embodiment, to further dissipate heat from the integrated heat spreader 130, a heat sink 150 optionally having fins 152 is coupled to the integrated heat spreader 130.

Figure 2:
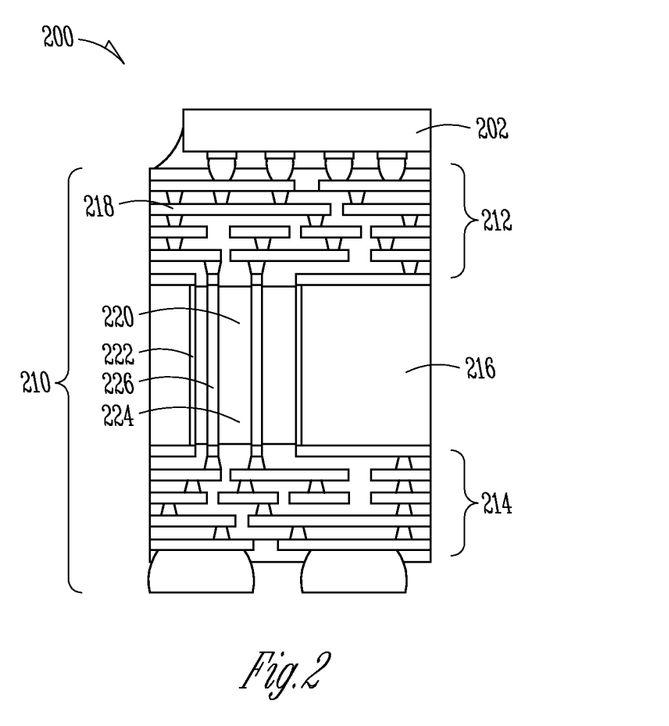
FIG. 2 is cross section view of a substrate and attached die in accordance with some embodiments.

FIG. 2 shows a semiconductor device 200 including a die 202 coupled to a substrate 210. In one example, the die 202 and substrate 210 are similar to die 110 and substrate 120 from FIG. 1. The die 210 may be any semiconductor die, such as a processor die, memory die, system on a chip, logic die, etc.

The substrate 210 includes a top layer 212, a bottom layer 214, and a core 216 sandwiched between the top layer 212 and the bottom layer 214. In the example shown, the top layer 212 and bottom layer 214 include a number of levels of interconnection circuitry 218. Such interconnection circuitry 218 may be formed by successive levels of deposition and photolithography. Although multiple levels of interconnection circuitry 218 are shown in FIG. 2, other examples may include fewer levels or only a single level of interconnection circuitry 218.

An elongated structure 220 is shown coupled between the top layer 212 and the bottom layer 214. In the example shown, the elongated structure 220 includes a wall conductor 222, a dielectric 224, and two internal conductors 226. Although two internal conductors 224 are shown as an example in FIG. 2, other examples include one internal conductor 224, or more than two internal conductors 224. Other examples of elongated structures are shown in more detail in the following figures and description.

Figure 3:
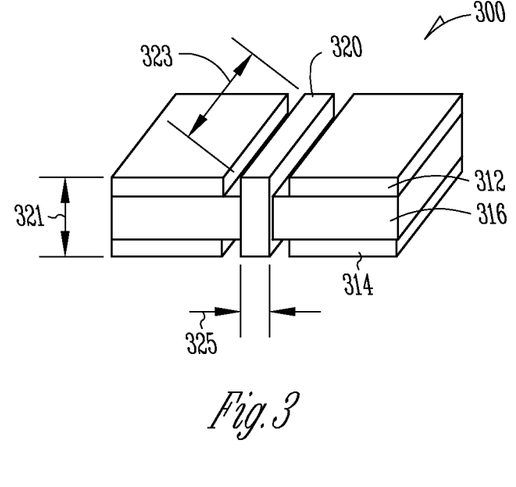
FIG. 3 is an isometric view of a portion of a substrate in accordance with some embodiments.

FIG. 3 shows a portion of a substrate 300 including an elongated structure 320. In FIG. 3, the substrate 300 includes a top conductor layer 312, a bottom conductor layer 314, and a core layer 316 sandwiched in between the top conductor layer 312 and the bottom conductor layer 314.

In one example, the top conductor layer 312 includes copper. In one example the bottom conductor layer 314 includes copper. Other conductors, such as aluminum, other metals, or metal alloys are also possible. In one example, the core layer 316 includes a dielectric material. A dielectric material is defined as less conductive than a conductor material. In one example the core layer 316 includes a polymer material. Examples of polymer dielectric materials include cured resin, such as an epoxy material. Other polymers or other dielectric materials are also possible.

In FIG. 3, the elongated structure 320 is a solid conductor structure, in contrast to an elongated slot with a conductor lining the walls of the elongated slot. A solid conductor provides better conduction than a structure with only the walls of the slot including a conductive lining. In one example, the elongated structure 320 includes solid copper. A solid elongated conductor such as elongated structure 320, or other elongated structures described in the present disclosure, provides greater conduction with lower resistance than a cylindrical conductor due to the larger cross section area.

The elongated structure 320 shown in FIG. 3 is illustrated having a thickness 321, a length 323, and a width 325. In one example, the thickness of the elongated structure 320 is between approximately 300-500 micro meters. In one example, the length of the elongated structure 320 is between approximately 50-300 micro meters. In one example, the width of the elongated structure 320 is between approximately 50-150 micro meters.

The elongated structure includes larger dimensions when compared to conductors such as through silicon vias (TSVs) formed in silicon. In contrast, TSV dimensions are typically on the order of between approximately 5 and 10 micro meters in diameter and between approximately 50 and 200 micro meters in depth.

The larger dimensions, such as the dimension ranges for the elongated structure 320 listed above, are difficult to manufacture, due to technical challenges such as plating chemistries and material deposition mechanisms. Methods of forming elongated structures such as elongated structure 320 have been discovered by the present inventors, and are discussed in more detail below.

Figure 4:
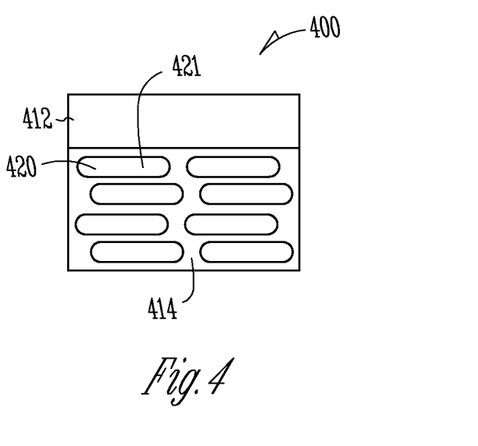
FIG. 4 is a top view of a portion of a substrate in accordance with some embodiments.

FIG. 4 shows a top view of a plurality of elongated structures 420 similar to elongated structure 320 from FIG. 3. A portion of a top conductor layer 412 has been removed, for example by lithography and chemical etching, exposing the dielectric core 414. Removal of the top conductor layer 412 provides electrical isolation for the elongated structures 420. In one example, a corresponding bottom conductor layer (not shown) of the substrate is also removed adjacent to the elongated structures 420 to provide electrical isolation.

The elongated structures 420 of FIG. 4 include rounded ends 421. In one example, the rounded ends 421 are formed when elongated trenches are cut, for example by laser milling, and subsequently filled with a conductor material such as copper to form the elongated structures 420.

Figure 5:
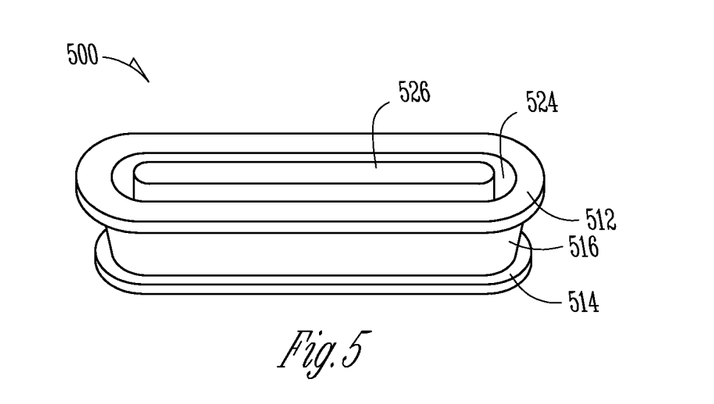
FIG. 5 is an isometric view of a conductor structure in accordance with some embodiments.

FIG. 5 shows an elongated structure 500 with the substrate not shown for ease of explanation, according to an embodiment of the invention. The elongated structure 500 includes a remaining top conductor portion 512 of the substrate, and a remaining bottom conductor portion 514 of the substrate. A wall conductor 516 is shown coupled between the remaining top conductor portion 512, and the remaining bottom conductor portion 514 of the substrate. In one example, the three conductive elements, 512, 514, and 516 provide an outside portion of a coaxial conductor. A dielectric 524 is shown separating an internal conductor 526 from the wall conductor 516.

Elongated structures that form coaxial conductors, such as in FIG. 5, provides signal isolation that reduces noise in surrounding components. In one example, power is supplied through the internal conductor 526, with at least the wall conductor 516 providing a shield that protects surrounding components such as data transmission lines. In one example, data is transmitted through the internal conductor 526, with at least the wall conductor 516 providing a shield that protects the internal conductor 526 from other sources of noise, such as power lines, that may be located outside the elongated structure 500.

Figure 6:
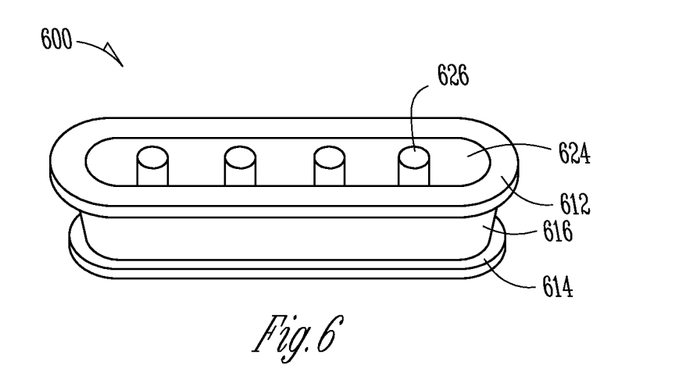
FIG. 6 is an isometric view another conductor structure in accordance with some embodiments.

FIG. 6 shows an elongated structure 600 with the substrate not shown for ease of explanation, similar to FIG. 5. The elongated structure 600 includes a remaining top conductor portion 612 of the substrate, and a remaining bottom conductor portion 614 of the substrate. A wall conductor 616 is shown coupled between the remaining top conductor portion 612, and the remaining bottom conductor portion 614 of the substrate. In one example, the three conductive elements, 612, 614, and 616 provide an outside portion of a coaxial conductor. A dielectric 624 is shown separating a plurality of internal conductors 626 from each other, and from the wall conductor 616. Although four internal conductors 626 are shown, other numbers of internal conductors 626 are within the scope of the invention.

Figure 7:
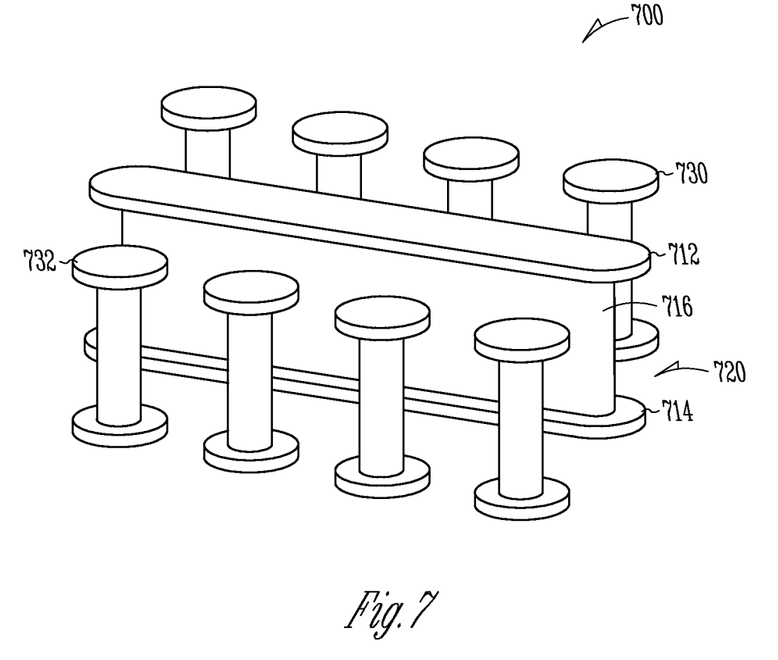
FIG. 7 is an isometric view another conductor structure in accordance with some embodiments.

FIG. 7 shows a portion of a device 700 with the substrate not shown for ease of explanation. An elongated structure 720 is shown according to an embodiment of the invention. The elongated structure 720 includes a remaining top conductor portion 712 of the substrate, and a remaining bottom conductor portion 714 of the substrate. A solid conductor portion 716 is shown coupled between the remaining top conductor portion 712, and the remaining bottom conductor portion 714 of the substrate.

The elongated structure 720 provides signal isolation that reduces noise in surrounding components such as first conductors 730 and second conductors 732. In the example of FIG. 7, signals, or power, etc, being transmitted through first conductors 730 are protected by the elongated structure 720 from any signals, or power, etc, being transmitted through second conductors 732. Although a straight line elongated structure 720 is shown for illustration, non-linear shapes such as boxes, "L" shapes, arcs, etc. can be formed to protect and/or at least partially enclose a portion of the substrate.

Figure 8:
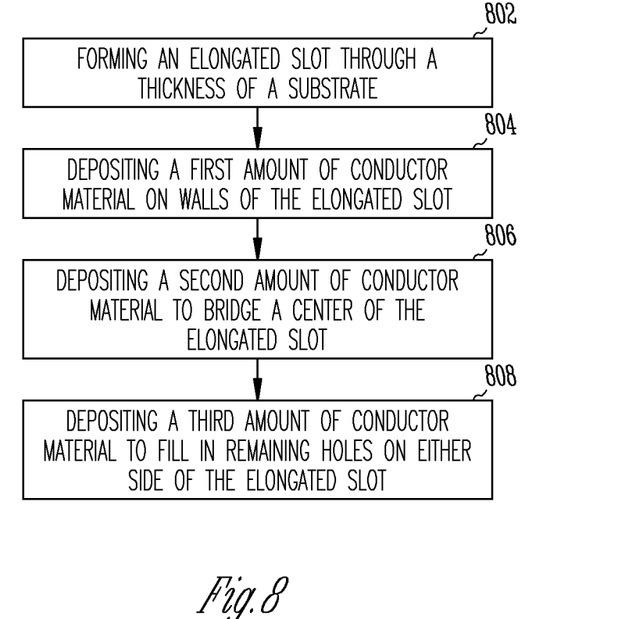
FIG. 8 is a flow diagram of a method in accordance with some embodiments.

FIG. 8 shows a block diagram of a method of forming a substrate according to an example embodiment. Operation 802 recites forming an elongated slot through a thickness of a substrate. Operation 804 then recites depositing a first amount of conductor material on walls of the elongated slot. Operation 806 then recites depositing a second amount of conductor material to bridge a center of the elongated slot. Then operation 808 recited depositing a third amount of conductor material to fill in remaining holes on either side of the elongated slot.

In one example, a panel with incoming copper foil of 12 micro meters goes through a half etch step to etch away a few microns of copper to a lower thickness for laser drill machines with lower power. For higher power machines, no half etch step is applied and the thicker copper is through.

Copper roughening is applied to increase the absorption energy of the laser. In one example the roughening is accomplished using a chemical etchant. Depending on the roughening treatment 2-3 micro meters may be removed following this process.

In one example, laser drilling is used to ablate core material in such a way as to form the non-cylindrical through holes in the core. In one example, this is accomplished in either a single drill/mill operation from one side of the core panel. In another example, it is accomplished by ablating material to form the pattern to partial depth in the core on one side and then ablating material on the other side of panel in the mirror image of the pattern used on the first side.

Following formation of the through holes, the recast material on the rim of copper around the shape is removed with a deburring process. This process is also effective at eliminating the overhanging copper on the core material. This step be completed either prior to or after a desmear process. In one example, the deburr treatment removes another 2-3 micro meters of copper from the surface in the process of removing the copper overhang and nodules formed from the recast material.

In one example, following laser drilling, the through holes go through an electroless copper plating process. In one example, a flash plate step is used which increases the thickness of plated Cu in the drilled through hole to a thickness of around 1 micro meter to enhance the conductivity of a seed layer.

A bridge plating step may then be used for closing the center of the two closest sides of the non-cylindrical though hole. In one example, the chemistry used in step includes a high acid concentration and low copper concentration to increase the throwing power in the through hole and enhance the conductivity at the center of the hole. Upon closing the center of the hole, two deep blind micro vias may be formed. In one example, a third plating step is used to fill the remainder of the holes on both sides with minimal voiding.

In one example, the third plating step has a high Cu concentration and low acid concentration since the filling process requires a significant amount of copper to both sides.

In one example, the plating process further involves solution agitation, current waveform adjustment, and plating solution adjustment. Higher solution flow and turnover is attractive for better solution exchange within the through hole, which facilitates delivering the necessary supply of copper ions in the hole for filling and additives on the sidewall so that a bottom up filling mechanism is achieved.

Once a hole reaches a point where a shallower depth is remaining for filling, a more aggressive current waveform can be applied with higher confidence of filling the rest of the hole without inclusions. The more aggressive waveform involves the use of periodic pulse plating to reduce the thickness of overplated copper on the surface and reduce the diffusion boundary layer at the higher current densities.

In methods of forming coaxial elongated structures, an example method may include a black oxide process to roughen plated copper after a first lining of walls in the slot. The roughening process may be used to enhance adhesion of a plugging resin that is used to fill the hole. Mechanical grinding may be subsequently applied to remove any additional resin.

Laser drilling or other suitable drilling techniques are then used to ablate the plugging resin in such a way as to form a non-cylindrical through holes in the resin. In one example, a single drill/mill operation is performed from one side of the core panel. In another example, the drill/mill operation is accomplished by ablating material to form the pattern to partial depth in the core on one side and then ablating material on the other side of panel in the mirror image of the pattern used on the first side.

Following laser drilling, a desmear is applied to roughen the plugging resin, and to enhance adhesion with a palladium catalyst. After desmear, copper filling techniques described above for bridging and filling in an elongated hole may be used to fill in the opening within the resin to complete an elongated coaxial conductor structure.

Figure 9:
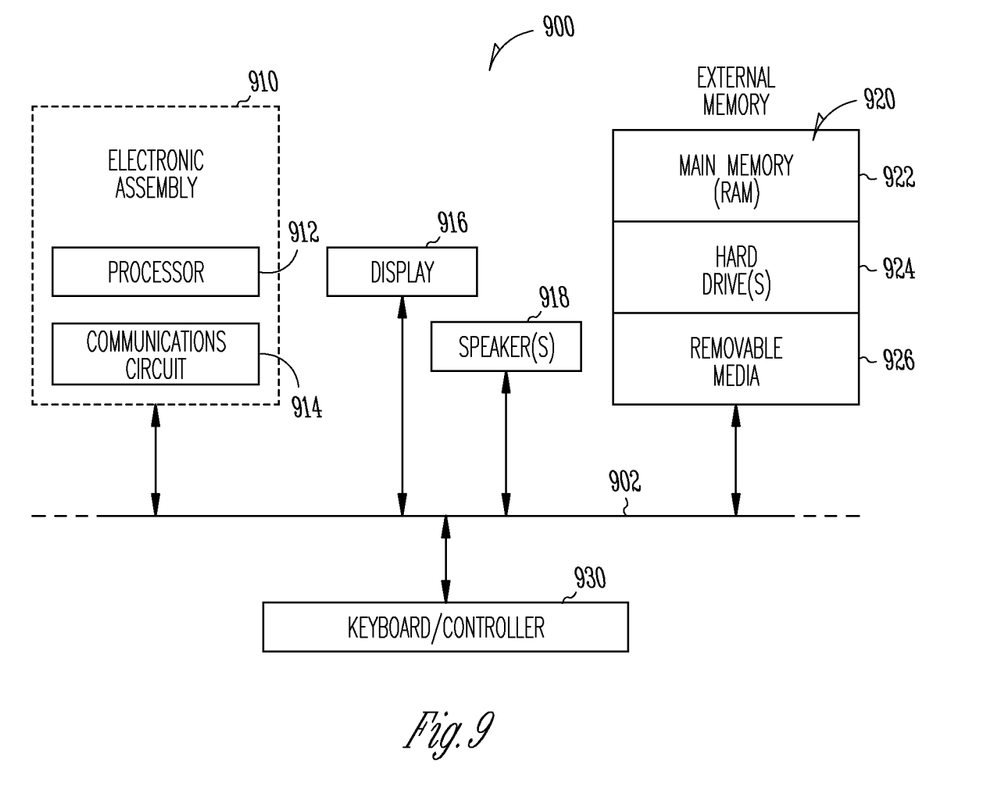
FIG. 9 is a block diagram of an electronic system in accordance with some embodiments.

An example of an electronic device using semiconductor chips and elongated structures as described in the present disclosure is included to show an example of a higher level device application for the present invention. FIG. 9 is a block diagram of an electronic device 900 incorporating at least one elongated structure and method in accordance with at least one embodiment of the invention. Electronic device 900 is merely one example of an electronic system in which embodiments of the present invention can be used. Examples of electronic devices 900 include, but are not limited to personal computers, tablet computers, mobile telephones, personal data assistants, MP3 or other digital music players, etc. In this example, electronic device 900 comprises a data processing system that includes a system bus 902 to couple the various components of the system. System bus 902 provides communications links among the various components of the electronic device 900 and can be implemented as a single bus, as a combination of busses, or in any other suitable manner.

An electronic assembly 910 is coupled to system bus 902. The electronic assembly 910 can include any circuit or combination of circuits. In one embodiment, the electronic assembly 910 includes a processor 912 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), multiple core processor, or any other type of processor or processing circuit.

Other types of circuits that can be included in electronic assembly 910 are a custom circuit, an application-specific integrated circuit (ASIC), or the like, such as, for example, one or more circuits (such as a communications circuit 914) for use in wireless devices like mobile telephones, pagers, personal data assistants, portable computers, two-way radios, and similar electronic systems. The IC can perform any other type of function.

The electronic device 900 can also include an external memory 920, which in turn can include one or more memory elements suitable to the particular application, such as a main memory 922 in the form of random access memory (RAM), one or more hard drives 924, and/or one or more drives that handle removable media 926 such as compact disks (CD), digital video disk (DVD), and the like.

The electronic device 900 can also include a display device 916, one or more speakers 918, and a keyboard and/or controller 930, which can include a mouse, trackball, touch screen, voice-recognition device, or any other device that permits a system user to input information into and receive information from the electronic device 900.

VARIOUS NOTES & EXAMPLES

Example 1 can include subject matter (such as an apparatus, a method, a means for performing acts) that can include or use an electronic device. The electronic device can include a semiconductor device, comprising a semiconductor chip, a substrate, including a dielectric core, attached to the semiconductor chip, and a solid elongated conductor through a thickness of the dielectric core in the substrate.

Example 2 can include, or can optionally be combined with the subject matter of Example 1 to include the solid elongated conductor substantially formed of copper.

Example 3 can include, or can optionally be combined with the subject matter of any one or more of Examples 1 or 2 to include wherein the solid elongated conductor is configured to transmit electricity between a top surface of the substrate and a bottom surface of the substrate.

Example 4 can include, or can optionally be combined with the subject matter of any one or more of Examples 1 through 3 to include wherein the solid elongated conductor is configured to shield signal carrying structures adjacent to the solid elongated conductor.

Example 5 can include, or can optionally be combined with the subject matter of any one or more of Examples 1 through 3 to include wherein the solid elongated conductor includes a non-linear structure that at least partially encloses a portion of the substrate.

Example 6 can include, or can optionally be combined with the subject matter of any one or more of Examples 1 through 5 to include a number of levels of interconnection circuitry located between the substrate and the semiconductor chip.

Example 7 can include, or can optionally be combined with the subject matter of any one or more of Examples 1 through 6 to include a number of levels of interconnection circuitry located on a side of the substrate opposite from the semiconductor chip.

Example 8 can include, or can optionally be combined with the subject matter of any one or more of Examples 1 through 7 to include wherein a thickness of the solid elongated conductor is between approximately 300-500 micro meters.

Example 9 can include, or can optionally be combined with the subject matter of any one or more of Examples 1 through 8 to include wherein a length of the solid elongated conductor is between approximately 50-300 micro meters.

Example 10 can include, or can optionally be combined with the subject matter of any one or more of Examples 1 through 9 to include wherein a width of the solid elongated conductor is between approximately 50-150 micro meters.

Example 11 can include, or can optionally be combined with the subject matter of any one or more of Examples 1 through 10 to include wherein the semiconductor chip includes a processor and wherein the processor is coupled to a memory device.

Example 12 can include a semiconductor device. The semiconductor device can include a semiconductor chip, and a substrate, including a dielectric core, attached to the semiconductor chip, an elongated slot through a thickness of the dielectric core in the substrate wherein walls of the elongated slot are covered with a wall conductor, and at least one internal conductor located within the elongated slot, and separated from the wall conductor by a dielectric.

Example 13 can include, or can optionally be combined with the subject matter of Example 12 to include wherein multiple internal conductors are separated from each other and from the wall conductor by the dielectric.

Example 14 can include, or can optionally be combined with the subject matter of any one or more of Examples 12 or 13 to include wherein the dielectric includes a polymer resin.

Example 15 can include, or can optionally be combined with the subject matter of any one or more of Examples 12 through 14 to include wherein the solid elongated conductor is substantially formed of copper.

Example 16 can include, or can optionally be combined with the subject matter of any one or more of Examples 12 through 15 to include wherein at least one internal conductor carries power.

Example 17 can include, or can optionally be combined with the subject matter of any one or more of Examples 12 through 16 to include wherein at least one internal conductor transmits a data signal.

Example 18 can include a method of forming a substrate. The method can include forming an elongated slot through a thickness of a substrate, depositing a first amount of conductor material on walls of the elongated slot, depositing a second amount of conductor material to bridge a center of the elongated slot, and depositing a third amount of conductor material to fill in remaining holes on either side of the elongated slot.

Example 19 can include, or can optionally be combined with the subject matter of Example 18 to include wherein depositing the first amount of conductor material includes depositing approximately 1 micro meter of copper on wall of the elongated slot.

Example 20 can include, or can optionally be combined with the subject matter of any one or more of Examples 18 or 19 to include wherein depositing the second amount of conductor material includes electroless plating copper using a first acid concentration, and a first copper concentration.

Example 21 can include, or can optionally be combined with the subject matter of any one or more of Examples 18 through 20 to include wherein depositing the third amount of conductor material includes electroless plating copper using a second acid concentration lower than the first acid concentration, and a second copper concentration higher than the second copper concentration.

Example 22 can include, or can optionally be combined with the subject matter of any one or more of Examples 18 through 21 to include wherein forming the elongated slot includes laser drilling the elongated slot.

Example 23 can include, or can optionally be combined with the subject matter of any one or more of Examples 18 through 22 to include depositing a dielectric to fill the elongated slot after the depositing the first amount of conductor material and laser drilling a second slot within the dielectric that is coaxial with the elongated slot, then depositing the second and third amount of conductor material within the second slot.

Each of these non-limiting examples can stand on its own, or can be combined with one or more of the other examples in any permutation or combination.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A semiconductor device, comprising:
a semiconductor chip;
a package substrate, including a dielectric core, attached to the semiconductor chip;
a first elongated conductor with rounded corners comprising a conductor extending from a top surface of the substrate to a bottom surface of the substrate through the dielectric core and elongated in a direction within a major plane of the package substrate, forming side walls of the elongated conductor;
first and second plate conductors, each rectangular in shape with rounded corners and elongated in the same direction as the elongated conductor, in contact with opposing ends of the elongated conductor at the top and bottom surface of the substrate; and
a single internal conductor situated between the side walls of the elongated conductor and extending from the top surface of the substrate to the bottom surface of the substrate, the single internal conductor separated from the side walls by the dielectric core, the single internal conductor elongated in a direction within the major plane of the package substrate and including a rectangular cross section with rounded corners in a direction parallel to the major plane of the package substrate and a rectangular cross section in a direction perpendicular to the major plane of the package substrate.

2. The semiconductor device of claim 1, wherein the single internal conductor is solid, rectangular, and includes rounded ends.

3. The semiconductor device of claim 1, wherein the elongated conductor includes copper.

4. The semiconductor device of claim 1, wherein the elongated conductor is configured to transmit electricity between a top surface of the substrate and a bottom surface of the substrate.

5. The semiconductor device of claim 1, wherein the elongated conductor is configured to shield signal carrying structures adjacent to the elongated conductor.

6. A semiconductor device, comprising:
a substrate comprising a dielectric core;
a first elongated conductor with rounded corners comprising a conductor extending from a top surface of the substrate to a bottom surface of the substrate through the dielectric core and elongated in a direction within a major plane of the package substrate, forming side walls of the elongated conductor;
first and second plate conductors, each rectangular in shape with rounded corners and elongated in the same direction as the elongated conductor, in contact with opposing ends of the elongated conductor at the top and bottom surface of the substrate; and
a single internal conductor situated between the side walls of the elongated conductor and extending from the top surface of the substrate to the bottom surface of the substrate, the single internal conductor separated from the side walls by the dielectric core, the single internal conductor elongated in a direction within the major plane of the substrate and including a rectangular cross section with rounded corners in a direction parallel to the major plane of the substrate and a rectangular cross section in a direction perpendicular to the major plane of the substrate.

7. The semiconductor device of claim 6, wherein the dielectric core includes a polymer resin.

8. The semiconductor device of claim 6, wherein the elongated conductor includes copper.

9. The semiconductor device of claim 6, wherein the single internal conductor carries power.

10. The semiconductor device of claim 6, wherein the single internal conductor transmits a data signal.

11. The semiconductor device of claim 6, wherein the single internal conductor is solid, rectangular, and includes rounded ends.

* * * * *